(12) United States Patent
Saito

(10) Patent No.: US 9,160,278 B2
(45) Date of Patent: Oct. 13, 2015

(54) WIRELESS COMMUNICATION DEVICE

(71) Applicant: Panasonic Corporation, Osaka (JP)

(72) Inventor: Noriaki Saito, Tokyo (JP)

(73) Assignee: PANASONIC CORPORATION, Osaka (JP)

( * ) Notice: Subject to any disclaimer, the term of this patent is extended or adjusted under 35 U.S.C. 154(b) by 95 days.

(21) Appl. No.: 14/118,011

(22) PCT Filed: Jan. 23, 2013

(86) PCT No.: PCT/JP2013/000335
§ 371 (c)(1),
(2) Date: Nov. 15, 2013

(87) PCT Pub. No.: WO2013/136649
PCT Pub. Date: Sep. 19, 2013

(65) Prior Publication Data
US 2015/0145605 A1     May 28, 2015

(30) Foreign Application Priority Data
Mar. 16, 2012   (JP) ................. 2012-060543

(51) Int. Cl.
*H03F 1/02* (2006.01)
*H03F 1/52* (2006.01)
*H03F 3/24* (2006.01)
(Continued)

(52) U.S. Cl.
CPC ............... *H03F 1/0238* (2013.01); *H03F 1/52* (2013.01); *H03F 3/19* (2013.01); *H03F 3/21* (2013.01); *H03F 3/24* (2013.01); *H03F 2200/393* (2013.01)

(58) Field of Classification Search
CPC .... H03F 1/0211; H03F 1/0233; H03F 1/0238
USPC ......................................................... 330/127
See application file for complete search history.

(56) References Cited

U.S. PATENT DOCUMENTS 6,166,598 A * 12/2000 Schlueter ...................... 330/127
7,205,843 B2    4/2007 Nagata
8,326,244 B2   12/2012 Maruhashi et al.
(Continued)

FOREIGN PATENT DOCUMENTS

JP    H05-314705 A    11/1993
JP    H07-170202 A     7/1995
(Continued)

OTHER PUBLICATIONS

International Search Report for Application No. PCT/JP2013/000335 dated Mar. 5, 2013.

*Primary Examiner* — Steven J Mottola
(74) *Attorney, Agent, or Firm* — Pearne and Gordon LLP

(57) ABSTRACT

Peak information about an envelope of a high frequency signal extracted from an output of a high frequency power amplifier (101) and information about a power supply voltage applied to the high frequency power amplifier (101) are detected. In order to suppress HCI degradation based on an additional value that is calculated by addition of the information, a controller (10) controls a power supply voltage regulation circuit (125) and a current regulation circuit (126), thereby automatically regulating a power supply voltage and an operating current for the high frequency power amplifier (101). Even when an output voltage exceeds the power supply voltage, a maximum value of a voltage applied to a transistor can be identified, so that HCI degradation can be suppressed.

6 Claims, 5 Drawing Sheets

(51) Int. Cl.
*H03F 3/19* (2006.01)
*H03F 3/21* (2006.01)

(56) References Cited

U.S. PATENT DOCUMENTS

| | | |
|---|---|---|
| 8,385,854 B2 | 2/2013 | Hadjichristos et al. |
| 2005/0140452 A1 | 6/2005 | Nagata |
| 2010/0225399 A1 | 9/2010 | Maruhashi et al. |
| 2011/0095826 A1 | 4/2011 | Hadjichristos et al. |

FOREIGN PATENT DOCUMENTS

| | | |
|---|---|---|
| JP | H09-282249 A | 10/1997 |
| JP | 3075233 B | 6/2000 |
| JP | 2005-191791 A | 7/2005 |
| WO | 2009-057385 A1 | 5/2009 |
| WO | 2010-135711 A1 | 11/2010 |

* cited by examiner

FIG.5

|  | TRANSMISSION POWER (OUTPUT POWER) | |
|---|---|---|
|  | LARGE | SMALL |
| POWER SUPPLY VOLTAGE | DECREASE | INCREASE |
| OPERATING CURRENT | INCREASE | DECREASE |

FIG.6

| CASE 1 | |
|---|---|
| TRANSMISSION POWER (OUTPUT POWER) | +7dBm |
| DRAIN TERMINAL VOLTAGE | 1Vpp |
| POWER SUPPLY VOLTAGE | 1.20V (= THRESHOLD OF 1.7V - 1 DRAIN AC AMPLITUDE Vpp /2) |
| OPERATING CURRENT | 30mA |

| CASE 2 | |
|---|---|
| TRANSMISSION POWER (OUTPUT POWER) | +1dBm |
| DRAIN TERMINAL VOLTAGE | 0.5Vpp |
| POWER SUPPLY VOLTAGE | 1.45V (= THRESHOLD OF 1.7V - 0.5 DRAIN AC AMPLITUDE Vpp /2) |
| OPERATING CURRENT | 27mA |

WIRELESS COMMUNICATION DEVICE

TECHNICAL FIELD

The present disclosure relates to a wireless communication device using a transistor in an analog circuit of a high frequency power amplifier.

BACKGROUND ART

In relation to a wireless communication device using a high frequency integrated circuit, HCI (Hot Carrier Injection) degradation of a high frequency power amplifier (HPA: High-Power Amplifier) has recently become an issue with advances in miniaturization of a CMOS process.

A hot carrier degradation detection circuit using a ring oscillator has hitherto been known as a related-art technique pertinent to countermeasures against HCI degradation (for instance, Patent Literature 1). Specifically, a ring oscillator which is configured by use of a transistor that is the same as that of a main body circuit is implemented on the same chip where there is the main body circuit that is a target of detection of hot carrier degradation. As the transistor to be inspected becomes degraded, an oscillation frequency of the ring oscillator changes. Accordingly, the hot carrier degradation detection circuit is capable of detecting, based on an oscillation frequency of the ring oscillator, a degree of degradation of the transistor of the main body circuit to be detected or whether or not the end of life of the transistor is reached.

Moreover, a transmission circuit whose output signal level is variable is known (see, for instance, Patent Literature 2). Specifically, in order to inhibit degradation of power efficiency or increase of power consumption, which would otherwise occur when the output signal is small, the transmission circuit decreases a power supply voltage and operating current when the output signal is small. In contrast, when the output signal is large, the transmission circuit increases the power supply voltage and the operating current. The transmission circuit can thereby reduce power consumption adaptively to the output signal.

CITATION LIST

Patent Literature

Patent Literature 1: Japanese Patent No. 3075233
Patent Literature 2: JP-A-7-170202

SUMMARY OF INVENTION

Technical Problem

According to Patent Literature 1, detection of HCI degradation is possible, whilst difficulty is encountered in increasing the longevity of a device by inhibiting occurrence of HCI degradation. In the meantime, according to Patent Literature 2, there is a necessity for increasing the power supply voltage when the output signal is large. For this reason, when the amplitude is large, a DC voltage applied to a drain terminal of the transistor becomes greater. For this reason, it becomes difficult to prevent occurrence of HCI degradation.

The disclosure has been provided in light of the aforementioned conventional circumstances and an object of the disclosure is to provide a wireless communication device that prevents deterioration of a characteristic of a power amplifying element, which would otherwise be induced by hot carrier injection degradation, and that controls transmission power in accordance with an output signal level.

Solution to Problem

The disclosure includes: a high frequency power amplifier, configured to amplify a high frequency signal by use of a power amplifying element; a wave detector, configured to extract the amplified high frequency signal based on an output from the high frequency power amplifier; an analog-digital converter, configured to determine a peak voltage of an envelope of the extracted high frequency signal; a power supply voltage regulation circuit, configured to regulate a power supply voltage supplied to the high frequency power amplifier; and a controller, configured to regulate an additional value to fall within a predetermined range, wherein the additional value is calculated by adding the power supply voltage supplied by the power supply voltage regulation circuit to the determined envelope peak voltage of the high frequency signal.

Advantageous Effects of Invention

According to the disclosure, it is possible to prevent deterioration of a characteristic of a power amplifying element, which would otherwise be induced by hot carrier injection degradation, and control transmission power in accordance with an output signal level.

BRIEF DESCRIPTION OF DRAWINGS

FIG. 5 is a table showing a relationship between a transmission output, a power supply voltage, and an operating current.

FIG. 6 is a table showing details of specific control requirements.

EMBODIMENTS OF INVENTION

Figure 1:
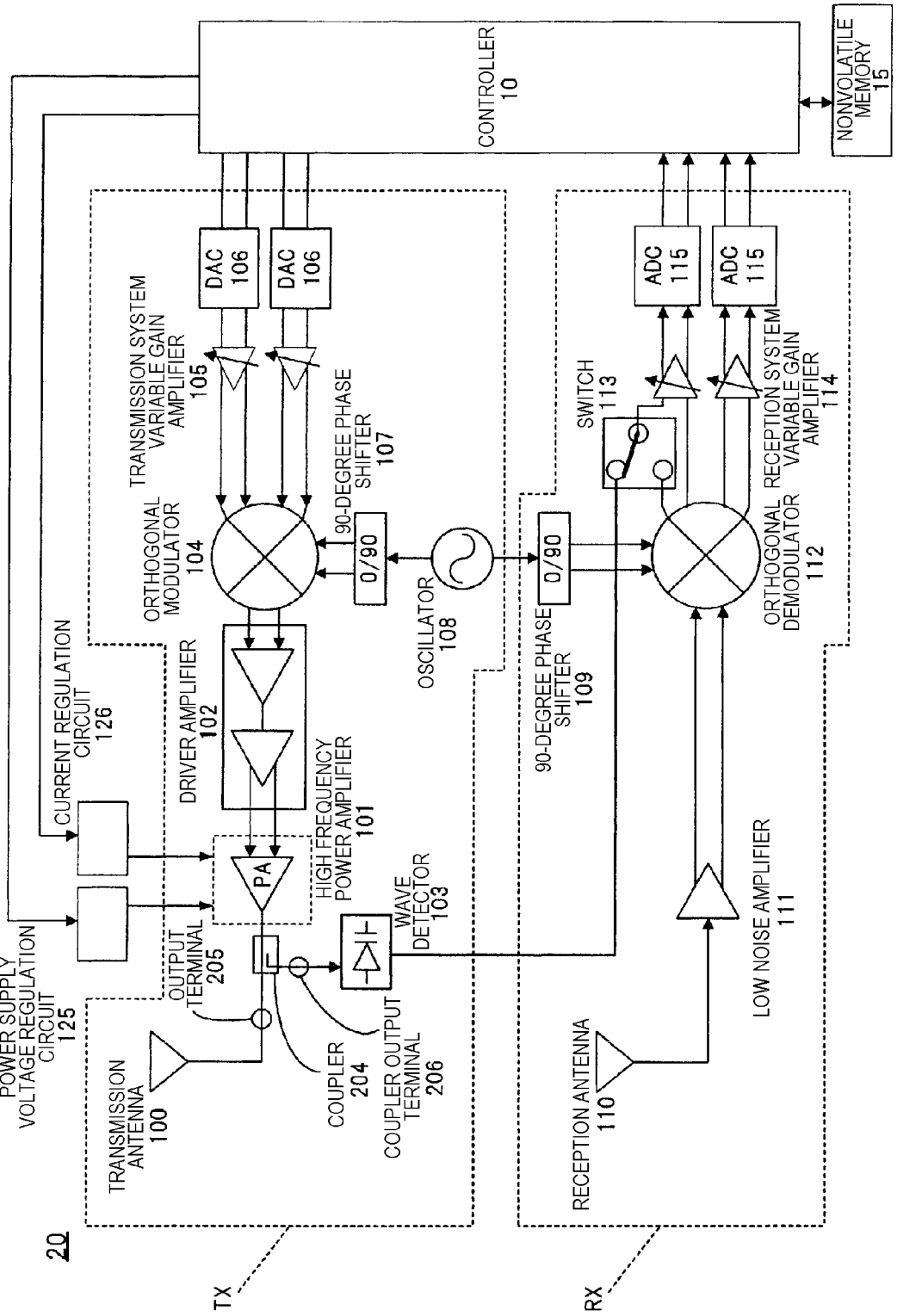
FIG. 1 is a block diagram of a wireless communication device according to an embodiment.

<Background to Details of an Embodiment of the Disclosure>

Before being given to an embodiment of a wireless communication device of the disclosure, explanations are first given to a background to details according to the embodiment of the wireless communication device of the disclosure.

HCI degradation is a phenomenon such as that described below. To be specific, as an electric field between a drain terminal and a source terminal of a transistor (e.g., MOSFET: Metal-Oxide Semiconductor Field Effect Transistor) becomes greater, high energy electrons called hot electrons occur. When the hot electrons are implanted into a gate electrode of the transistor, a rise in threshold voltage and a decrease in drain terminal current of the transistor are induced, which results in deterioration of transistor performance.

HCI degradation is closely pertinent to a voltage that exists between the drain terminal and the source terminal. Specifically, HCI degradation proceeds more rapidly with an increase in the voltage applied to the drain terminal and the source terminal of the transistor.

In the meantime, guaranteed common longevity of product quality is 10 years or thereabouts in many cases. Accordingly, in order to guarantee usage of a product for; for instance, 10 years, there is a necessity for holding down a degree of deterioration of a drain terminal current of the transistor within; for instance, 10 percents. For this reason, a limit is usually placed on the maximum voltage applied between the drain terminal and the source terminal of the transistor.

In a digital circuit, the voltage applied between the drain terminal and the source terminal of the transistor does not exceed a power supply voltage. Hence. HCI degradation of the transistor can be prevented, so long as a limit is placed on the power supply voltage. In an analog circuit that uses an inductor as load, however, there is a case where a voltage appearing at the drain terminal of the transistor sometimes exceeds the power supply voltage, and HCI degradation is likely to proceed.

The voltage applied between the drain terminal and the source terminal of the transistor affects performance of the analog circuit (e.g., a gain and saturation power). Accordingly, simply lowering the power supply voltage is unadvisable.

Patent Literature 1 and Patent Literature 2 are introduced as Patent Literatures that relate to countermeasures against HCI degradation.

According to Patent Literature 1, detecting HCI degradation is possible. However, difficulty is encountered in extending the longevity of the device by preventing occurrence of HCI degradation.

In contrast, according to Patent Literature 2, the power supply voltage must be increased when the output signal is large. Consequently, the DC voltage applied to the drain terminal of the transistor increases when an amplitude is large. For these reasons, preventing occurrence of HCI degradation is difficult.

For instance, in relation to a wireless communication conforming to WiGig (Wireless Gigabit) standards using a frequency of the order of 60 GHz at a millimeter waveband, a transistor is fabricated by means of fine processes. Hence, a small difference exists between an actual operating frequency and a current chopping frequency ft that represents an upper limit frequency which allows transistor operation. Consequently when the current chopping frequency ft of the transistor degreases for reasons of HCI degradation, an amplification factor of the transistor achieved at an actual operating frequency decreases, whereupon a transmission output is decreased and becomes difficult to use actually.

Further, when a small difference exists between the current chopping frequency ft and the actual operating frequency, a source-grounded amplifier that uses one source-grounded transistor and takes an inductor as load is used in a final stage circuit of the high frequency power amplifier (HPA). Therefore, the high frequency power amplifier is susceptible to HCI degradation.

Accordingly, explanations are hereunder given to an example wireless communication device that prevents deterioration of a characteristic of a power amplifying element, which would otherwise be caused by hot carrier injection degradation, and that controls transmission power in accordance with an output signal level.

A specific embodiment of the wireless communication device of the disclosure is hereunder described by reference to the drawings.

<Configuration of a wireless Communication Device>

FIG. 1 is a block diagram of a wireless communication device 20 according to the embodiment. The wireless communication device 20 shown in FIG. 1 includes a transmission system circuit TX; a reception system circuit RX; a power supply voltage regulation circuit 125; a current regulation circuit 126; and a controller 10 that controls entire operation of the wireless communication device 20.

In this regard, the wireless communication device 20 according to the embodiment does not need to include the reception system circuit. RX. The wireless communication device 20 according to the embodiment uses a frequency of the order of 60 GHz at a millimeter waveband in; for instance, a wireless communication conforming to WiGig standards. Although differential signals are input, to and output from the wireless communication device 20 shown in FIG. 1, a single-end signal can also be input and output.

In FIG. 1, the transmission system circuit TX includes DACs 106, transmission system variable gain amplifiers 105, an orthogonal modulator. 104, a 90-degree phase shifter 107, an oscillator 108, a driver amplifier 102, a high frequency power amplifier 101, a coupler 204, a wave detector 103, an output terminal 205, a coupler output terminal 206, and a transmission antenna 100. An output of the high frequency power amplifier 101 is input to the wave detector 103 by way of the coupler 204. An output of the wave detector 103 is input to the reception system circuit by way of a switch 113. The oscillator 108 can also be incorporated in the reception system circuit. RX rather than in the transmission system circuit TX.

In FIG. 1, the reception system circuit RX includes a reception antenna 110; a low noise amplifier (LNA: Low Noise Amplifier) 111, an orthogonal demodulator 112, a 90-degree phase shifter 109, a switch 113, a reception system variable gain amplifier 114, and ADCs 115. The wireless communication device 20 is provided with two reception system gain amplifiers 114, and the switch 113 selectively switches a signal input to one of the reception system variable gain amplifiers 114. Namely, the switch 113 switches a source of a signal destination between the output of the wave detector 103 and the output of the orthogonal demodulator 112 according to a control signal output from the controller 10.

In the transmission system circuit. TX of the wireless communication device 20 shown in FIG. 1, a transmission signal of differential signals is converted by two DACs (digital-analog converters) 106 from a digital signal to an analog signal, and an analog IQ signal is output from the two DACs 106.

The signals output from the two DACs 106 are amplified by the two transmission system variable gain amplifiers 105. The signals amplified by the respective transmission system gain variable amplifiers 105 are orthogonally modulated by the orthogonal modulator 104 in accordance with two local signals that are made by the oscillator 108 and the 90-degree phase shifter 107 and that have the same amplitude and are 90 degrees out of phase with each other. The orthogonally modulated signals are input to the driver amplifier 102.

The driver amplifier 102 receives, as an input, the orthogonally modulated signals and amplifies the thus-input signals, outputting the amplified signals to the high frequency power amplifier 101. The high frequency power amplifier 101 amplifies power (level) of an analog signal output from the driver amplifier 102.

The power supply voltage regulation circuit 125 and the power supply current regulation circuit 126 are connected to the high frequency power amplifier 101 according to the embodiment. The power supply voltage regulation circuit 125 regulates and applies a DC voltage that serves as a power supply voltage of the high frequency power amplifier 101 in accordance with a command from the controller 10. The current regulation circuit 126 regulates and supplies an operating current for the high frequency power amplifier 101 in accordance with the command from the controller 10.

A high frequency signal amplified by the high frequency power amplifier 101 is transmitted as a radio wave from the transmission antenna 10 by way of the output terminal 205. A portion of the high frequency signal amplified by the high frequency power amplifier 101 is extracted by the coupler 204 and input to the wave detector 103 by way of the coupler output terminal 206. A signal output from the wave detector 103 is input to one of the ADCs (Analog-Digital Converters) 115 by way of the switch 113 and the reception system gain variable amplifier 114.

In the reception system circuit RX of the wireless communication device 20 shown in FIG. 1, a high frequency reception signal of the radio wave received by the reception antenna 110 is input to the low noise amplifier 111. The low noise amplifier 111 amplifies the thus-input high frequency reception signal with lower noise. The high frequency reception signals output from the low noise amplifier 111 are demodulated by the orthogonal demodulator 112 in accordance with two local signals that are generated by the oscillator 108 and the 90-degree phase shifter 109 with the same amplitude and 90 degrees out of phase with each other.

One of the reception signals of the thus-demodulated differential signals is input to the switch 113, and the other reception signal is input to the other of the two reception system variable gain amplifiers 114. One of the reception signals output from the switch 113 is input, to one of the two reception system variable gain amplifiers 114. The reception signals amplified by the two reception system variable gain amplifier 114 are input to the two ADCs 115, where the reception signals are converted from analog reception signals into digital reception signals. The digital reception signals converted by the two ADCs 115 are input to the controller 10.

<Specific Configuration of the High Frequency Power Amplifier 101>

Figure 2:
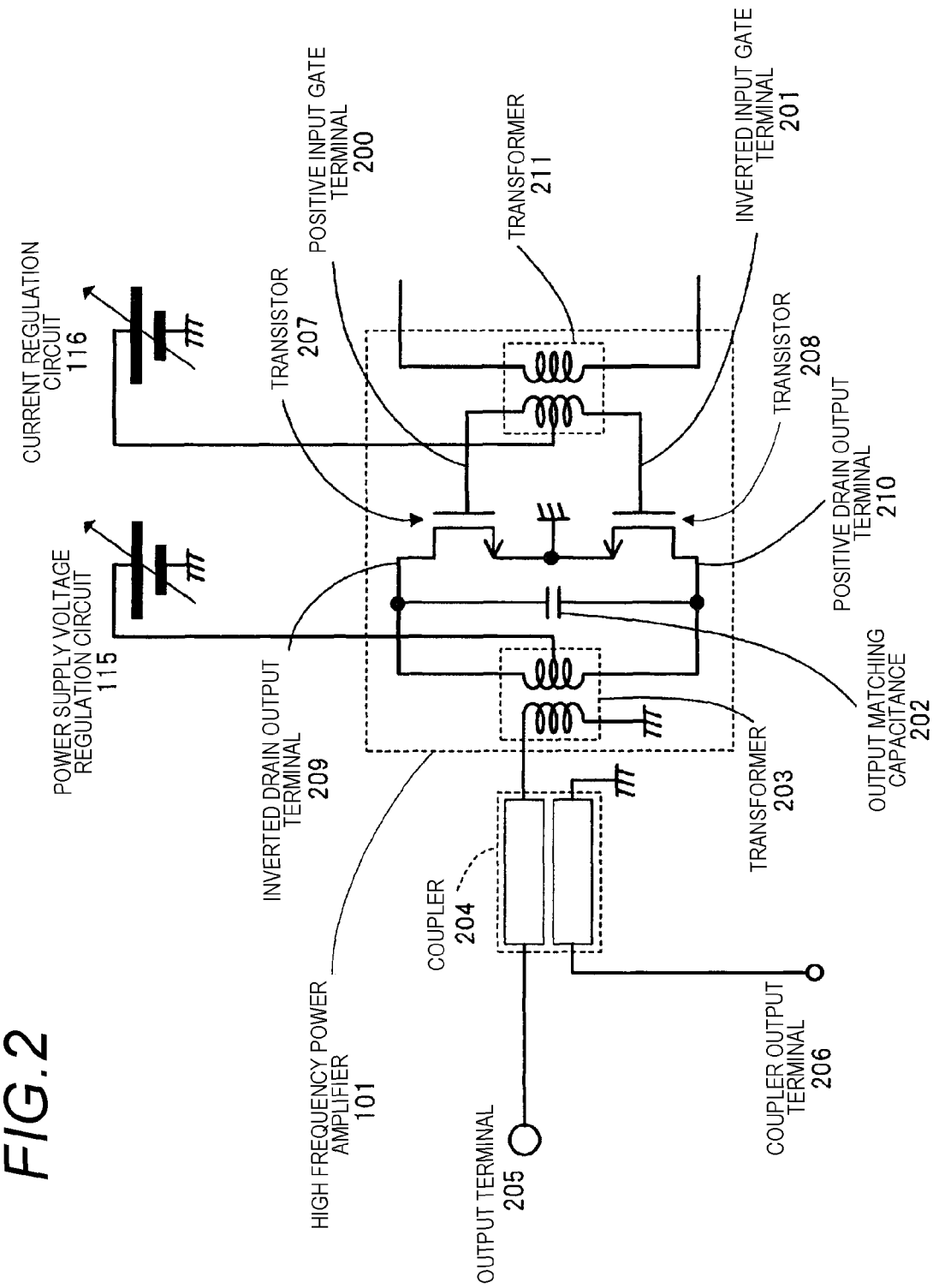
FIG. 2 is a circuit diagram showing a configuration of a specific analog circuit of a high frequency power amplifier in the wireless communication device shown in FIG. 1.

FIG. 2 is a circuit diagram showing a configuration of a specific analog circuit of the high frequency power amplifier 101 in the wireless communication device 20 shown in FIG. 1.

The high frequency power amplifier 101 shown in FIG. 2 includes an input side transformer 211, two transistors 207 and 208, an output matching capacitance 202, an output side transformer 203, and an output terminal 205. A secondary side electric current of the input side transformer 202; namely, operating currents (control currents) for the transistors 207 and 208, are supplied, after being regulated, by the current regulation circuit 116.

The transistors 207 and 208 are fabricated by the fine CMOS process and are configured by for instance, a MOSFET. The transistors 207 and 208 amplify power of a signal output to the secondary side of the input side transformer 211 at a high frequency band (millimeter waveband) of the order of; for instance, 60 GHz.

The transistor 207 has a positive input gate terminal 200 and an inverted drain output terminal 209. A source terminal of the transistor 207 is grounded.

The transistor 208 has an inverted input, gate terminal 201 and a positive drain output terminal 210. A source terminal of the transistor 208 is grounded.

One of electrodes of the output matching capacitance 202 is connected to the inverted drain output terminal 209, and the other of the electrodes of the output matching capacitance 202 is connected to the positive drain output terminal 210. To be specific, the output matching capacitance 202 is connected to the inverted drain output terminal 209 and the positive drain output terminal 210.

The output side transformer 203 is connected to both the positive drain output terminal 210 and the inverted drain output terminal 209. A result of single phase composition of differential outputs from the positive drain output terminal 210 and the inverted drain output terminal 209 is output to the secondary side of the transformer 203. A voltage appearing on the primary side of the output-side transformer 203 is regulated and applied by the power supply voltage regulation circuit 125.

An output from the secondary side of the transformer 203 is output to the output terminal 205 by way of the coupler 204. An output from the secondary side of the transformer 203 is output to the coupler output terminal 206 as a signal that the coupler 204 attenuated by about 20 dB to 30 dB.

<Specific Example of a Signal Waveform>

Figure 3:
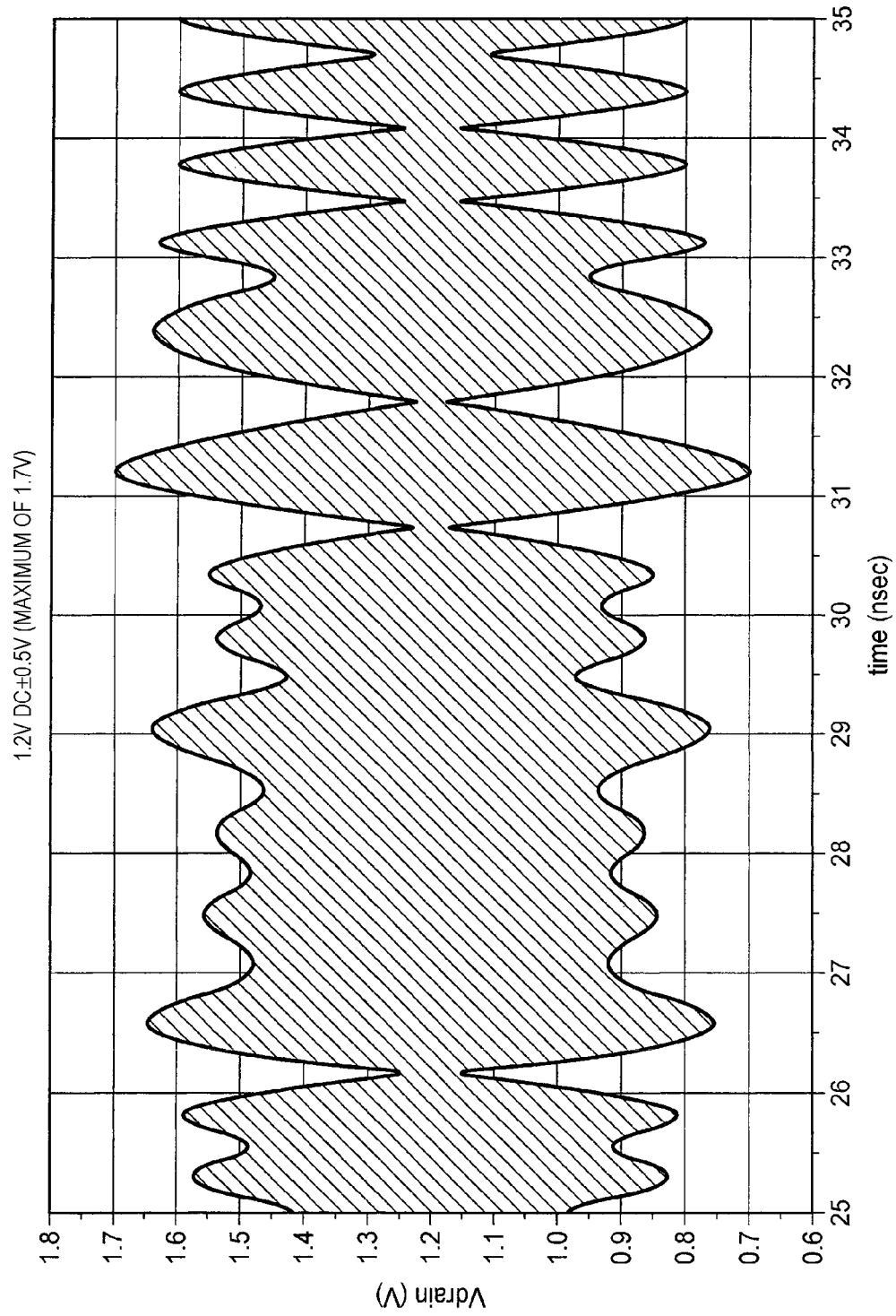
FIG. 3 is a waveform chart showing a signal waveform (voltage) appearing at a positive drain output terminal during modulation of the high frequency power amplifier shown in FIG. 2.
Figure 4:
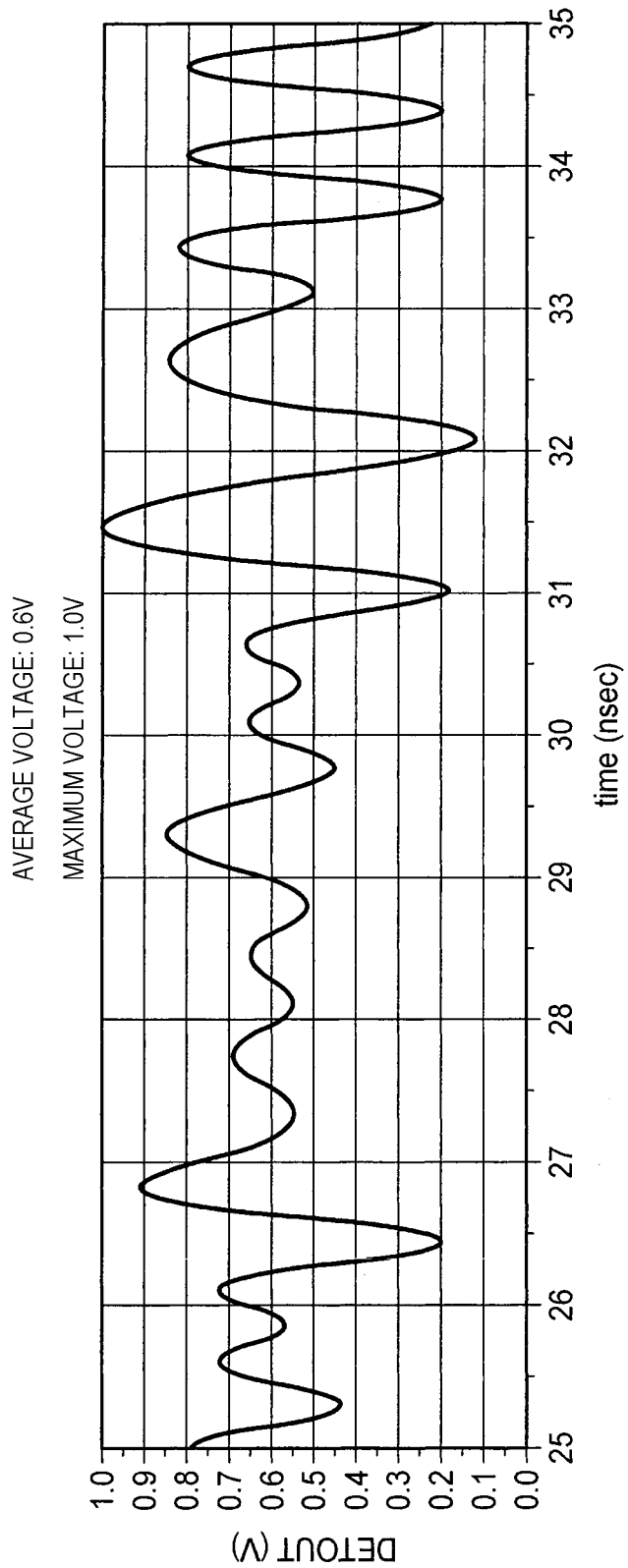
FIG. 4 is a waveform chart showing an output waveform appearing at a coupler output terminal in the wireless communication device shown in FIG. 1; namely, an output voltage of a waveform detector.

FIG. 3 is a waveform chart showing a signal waveform (voltage) appearing at the positive-phase drain output terminal 210 during modulation of the high frequency power amplifier 101 shown in FIG. 2. The signal waveform shown in FIG. 3 is a modulated waveform and includes a carrier wave component; namely, a high frequency signal (a frequency of about 60 GHz) output from the oscillator 108. FIG. 4 is a waveform chart showing a waveform output from the coupler output terminal 206 of the wireless communication device 20 shown in FIG. 1; namely, a voltage output from the wave detector 103.

For instance, in a case where a DC voltage (power supply voltage) applied as an output from the power supply voltage regulation circuit 125 to the high frequency power amplifier 101 is 1.2V a voltage that exceeds a power supply voltage (1.2V) develops in the inverted drain output terminal 209 and the positive drain output terminal 210 under influence of the transformer 203. Specifically, in FIG. 3, a variation occurs in a voltage with a maximum of 1.7V with respect to a power supply voltage of 1.2V.

Specifically, the voltage applied between the drain terminal and the source terminal of the transistor 207 and the voltage applied between the drain terminal and the source terminal of the transistor 208 exceed the power supply voltage. When the voltages exceed the power supply voltage, HCI degradation proceeds in each of the transistors 207 and 208. When the current chopping frequency ft of each of the transistors 207 and 208 is reduced by HCI degradation, an amplification factor of the transistor 207 and an amplification factor of the transistor 208 that are achieved at the operating frequency of e.g., 60 GHz) also decrease respectively, whereupon a transmission output also decreases, thereby posing difficulty on actual use of the high frequency power amplifier 101. To be specific, product cycle of the wireless communication device 20 becomes shorter.

<Control of the Power Supply Voltage>

Operation of the wireless communication device 20 is now described. Assume that the power supply voltage applied to the high frequency power amplifier 101 is 1.2V and that a voltage appearing at the positive drain output terminal 210 comes to a maximum of 1.7V (see FIG. 3).

In FIG. 4, the signal output from the wave detector 103 assumes a waveform of an AC signal that is equivalent to an envelope of a signal appearing at the positive drain output terminal 210. Accordingly, the signal output from the wave detector 103 shows transmission output information but differs from the maximum voltage appearing at the positive drain output terminal 210. In short, difficulty is encountered in detecting a maximum voltage at the positive drain output terminal 210 by means of the signal output from the wave detector 103.

For instance, according to Patent Literature 2, the output of the wave detector 103 is fed back to a gain control system after being smoothed by use of an appropriate low pass filter (LPF). Hence, grasping the maximum voltage appearing at the positive drain output terminal 210 is difficult. Namely, the gain control system described in connection with Patent Literature 2 does not take into account the maximum voltage appearing at the positive drain output terminal 210. Hence, there is a need to detect a level of the signal smoothed by the low pass filter without use of envelope information and feed back the thus-detected level to the gain control system.

The wireless communication device 20 shown in FIG. 1 performs control operation as follows in order to prevent HCI degradation of the transistors 207 and 208. Specifically, the wireless communication device 20 detects the output of the wave detector 103 without smoothing it in order to acquire an absolute value of a voltage appearing at the inverted drain output terminal 209 of the transistor 207 and an absolute value of a voltage appearing at the positive drain output terminal 210 of the transistor 208. The wireless communication device 20 detects a peak level of the output of the wave detector 103 by use of the ADC 115 that can operate at high speed.

The reception system circuit. RX of the wireless communication device 20 is provided with, as an analog-digital converter that can operate at high speed, the two ABCs 115. The ADCs 115 detect a peak level of a high frequency signal output from the wave detector 103.

During receiving operation of the wireless communication device 20, the switch 113 connects an output of the orthogonal demodulator 112 to an input of the ADC 115, outputting an orthogonal demodulated reception signal to the ADC 115.

Further, when the power supply voltage of the high frequency power amplifier 101 is regulated in the transmission system circuit TX, the switch 113 connects the output of the wave detector 103 to the input of the ADC 115.

Based on the output from the wave detector 103, the controller 10 adds peak voltage information, which is obtained as a result of conversion performed by the ADCs 115, to power supply voltage information output from the power supply voltage regulation circuit 125. Accordingly, the controller 10 can acquire the maximum peak voltage value at the inverted drain output terminal 209 of the transistor 207 and the maximum peak voltage value at the positive drain output terminal 210 of the transistor 208.

The controller 10 controls (regulates) the power supply voltage of the high frequency power amplifier 101 within the limits of requirements for suppressing HCI degradation specified for the process of fabricating the transistors 207 and 208.

Specific example requirements for suppressing HCI degradation include; for instance, 1.7V which is 1.4 times as high as 1.2V that is a center voltage of the power supply voltage. In this case, a voltage of 1.7V is taken as a threshold. Requirements for suppressing HCI degradation can be also changed as required. The controller 10 can thereby control (regulate) an optimum power supply voltage that takes into account HCI degradation.

The example shown in FIG. 3 shows a waveform of the voltage appearing at the positive drain output terminal 210. In the example shown in FIG. 3, the center voltage of the power supply voltage is 1.2V; an amplitude is ±0.5V; and the maximum voltage is 1.7V. An example shown in FIG. 4 shows a waveform of a voltage that is obtained by normalizing the voltage of the coupler output terminal 206 such that an amplitude peak of the voltage assumes the same voltage waveform as that shown in FIG. 3.

In the embodiment, the threshold of the voltage applied between the drain terminal and the source terminal of the transistor 207 and the threshold of the voltage applied between the drain terminal and the source terminal of the transistor 208 are set to 1.7V in order to suppress HCI degradation. Accordingly, a voltage of 1.2V that is a result of one half of the maximum value 1V of the coupler output being subtracted from the threshold of 1.TV is previously set as an upper limit value of the power supply voltage at the drain terminal. In other words, the power supply voltage regulation circuit 125 regulates the power supply voltage applied to the high frequency power amplifier 101; namely, the voltage value of each of the drain terminals of the transistors 207 and 208, to 1.2V.

To be specific, the controller 10 acquires from the ADCs 115 a peak voltage of the high frequency signal that is obtained as an output from the wave detector 103. The controller 10 controls (regulates) the power supply voltage regulation circuit 125 such that a peak voltage which is obtained adding the peak voltage acquired from the ADCs 115 to the preset power supply voltage; namely, the maximum value of the voltage applied between the drain terminal and the source terminal of the transistor 207 and the maximum value of the voltage applied between the drain terminal and the source terminal of the transistor 208, does not exceed the threshold (1.7V).

The wireless communication device 20 can thereby actuate the high frequency power amplifier 101 at the maximum voltage that is less susceptible to HCI degradation while taking into account both the power supply voltage and the output amplitude.

<Control of the Operating Current>
<Case where Output Power is Large>

When the power supply voltage is lowered in order to inhibit HCI degradation, a signal level will become easily saturated if the amplitude of the high frequency signal in the high frequency power amplitude 101 is high, which will create distortion in the signal. In order to avoid the distortion, the amplitude of the high frequency signal must be held down. However, when the amplitude is held down, output power is also decreased. For these reasons, the controller 10 causes the current regulation circuit 126 to increase the operating current for the high frequency power amplifier 101 and keep output power of the high frequency power amplifier 101 unchanged.

<Case where the Output Power is Small>

In the meantime, when the output power of the high frequency power amplifier 101 is comparatively small, the amplitude of the high frequency signal of the high frequency power amplifier 101 becomes comparatively smaller. Moreover, there is no necessity for taking into account HCI degradation, and the power supply voltage regulation circuit 125 increases a power supply voltage applied to the high frequency power amplifier 101.

When the power supply voltage applied to the high frequency power amplifier 101 is increased, the signal level is less susceptible to saturation. Therefore, even when the amplitude of the high frequency signal is increased, distortion becomes less likely to occur in the signal. In short, the power supply voltage regulation circuit 125 can increase the amplitude of the high frequency signal as necessary.

The source for supplying power to the wireless communication device 20 is formed by; for instance, a battery that produces a given output voltage. Power equivalent to a difference between an output voltage of the power supply source (battery) and the power supply voltage output from the power supply voltage regulation circuit 125 is dissipated as heat in the power supply voltage regulation circuit 125. Specifically, even when the output power of the wireless communication device 20 is low, the power is dissipated by the power supply voltage regulation circuit 125, to that battery consumption is accelerated.

Accordingly, when the power output from the high frequency power amplifier 101 is comparatively small, the controller 10 causes the power supply voltage regulation circuit 125 to increase the power supply voltage of the high frequency power amplifier 101 and the current regulation circuit 126 to decrease the operating current of the high frequency power amplifier 101. The power consumption of the high frequency power amplifier 101 is thereby reduced.

<Control Specifics of the Controller 10>

FIG. 5 is a table showing a relationship between transmission power (output power), a power supply voltage, and an operating current. FIG. 6 is a table showing details of specific control requirements.

To be specific, as shown in FIG. 5, when the output power of the high frequency power amplifier 101 is large, the controller 10 causes the power supply voltage regulation circuit 125 to decrease the power supply voltage applied to the high frequency power amplifier 101 and the current regulation circuit. 126 to increase the operating current of the high frequency power amplifier 101.

In the meantime, when the output power of the high frequency power amplifier 101 is small, the controller 10 causes the power supply voltage regulation circuit 125 to increase the power supply voltage applied to the high frequency power amplifier 101 and the current regulation circuit 126 to decrease the operating current of the high frequency power amplifier 101.

The controller 10 thereby inhibits HCI degradation of the transistors 207 and 208, enabling extension of the product life of the wireless communication device 20. Further, when the output power is small, the controller 10 can inhibit power consumption.

A specific switching example is now described. In an example shown in FIG. 6, Case 1 and Case 2 are set as two types of control requirements.

In Case 1; namely, a case where transmission power is "±7 dBm," the controller 10 decreases the power supply voltage to 1.2V and, in addition, increases the operating current to 30 mA when an amplitude of each of AC outputs of the drain terminal of the transistor 207 and the drain terminal of the transistor 208 reaches 1 Vpp. The maximum voltages appearing at the drain terminals come to 1.7V.

In Case 2; namely, a case where transmission power is "±1 dBm," the controller 10 increases the power supply voltage to 1.45V and, in addition, decreases the operating current to 27 mA when the amplitude of each of AC outputs of the drain terminal of the transistor 207 and the drain terminal of the transistor 208 reaches 0.5 Vpp. The maximum voltages appearing at the drain terminals come to 1.7V.

It is preferable to measure in advance as calibration an optimum value of a specific power supply voltage and an optimum value of a specific operating current in connection with two types or more operating requirements shown in FIG. 6, thereby determining the optimum power supply voltage and the optimum operating current for the wireless communication device 20. Data pertinent, to the optimum value of the power supply voltage and the optimum value of the operating current that are determined by calibration are stored as a table in nonvolatile memory 15 to which the controller 10 can make reference.

Accordingly, based on the thus-detected transmission power, the controller 10 causes the power supply voltage regulation circuit 125 and the current regulation circuit 126 to apply and supply the drain terminal voltage and the operating current to the high frequency power amplifier 101, with reference to the data pertinent to the optimum value of the power supply voltage and the optimum value of the operating current stored in the nonvolatile memory 15.

<Modification>

In the wireless communication device 20, when the high frequency power amplifier 101 transmits a modulated wave, the controller 10 uses values of peak voltages (outputs from the ADCs 115) that makes up an envelope of the high frequency signal detected from the output of the high frequency power amplifier 101 by the wave detector 103.

The wireless communication device 20 can also detect an output of the high frequency power amplifier 101 by use of a CW (Continuous Wave=an unmodulated continuous sinusoidal wave) signal. More specifically, in order to identify the drain terminal voltage of the transistors 207 and 208, the controller 10 detects a level of an output signal while the transmission system circuit of the wireless communication device 20 is in a state of unmodulation; namely when the high frequency power amplifier 101 is in the course of outputting a carrier wave.

In this case, high speed changes, such as those shown in FIG. 4, do not exist in the output signal of the wave detector 103, the ADCs 115 do not need to perform AD conversion processing at high speed to detect a peak level. Accordingly, control becomes feasible without utilization of the ADCs 115 that can operate at high speed, so that processing speed of analog-to-digital conversion is lowered, thereby enabling the reduction of power consumption.

In this respect, a difference will arise between the peak level detected based on the output signal of the wave detector 103 and the drain voltages of the transistors 207 and 208 depending on whether a modulated wave or an unmodulated wave is used.

Accordingly, a correlation between optimum control requirements for the case of use of a modulated wave and optimum control requirements for the case of use of an unmodulated signal is previously measured as calibration in a laboratory. Data pertinent to an optimum value of the power supply voltage and an optimum value of the operating current, which are obtained as measurement results, are stored in the nonvolatile memory 15, and data pertinent to the optimum values are used as control requirements.

Therefore, even when the controller 10 controls the power supply voltage regulation circuit 125 and the current regulation circuit. 126 based on the peak level of the high frequency signal detected by use of the unmodulated signal, the power supply voltage and the operating current can be controlled by use of optimum requirements when a modulated wave is transmitted in reality. Accordingly the operating frequency of the ADCs 115 is lowered, which enables further reduction of the power consumed by the ADCs 115.

In a millimeter wave wireless communication of the order of 60 GHz, when the transistors 207 and 208 fabricated through the fine process are used for the analog circuit of the high frequency power amplifier 101 and when a small difference exists between the current chopping frequency ft that represents an upper limit of the frequency which allows operation of the transistors 207 and 208 and the actual operating frequency, the transistors 207 and 208 are grounded to the source in a final-stage circuit; and an inductor (e.g., the transformer 203) is taken as load. The output voltage of the drain corresponds to the center of the power supply voltage, and there is no alternative way but to use a source-grounded amplifier that causes oscillation with a large amplitude. Therefore, an advantage of the disclosure becomes more enhanced. In this regard, the large amplitude means a voltage that is not negligible with reference to the center of the power supply voltage; for instance, about 10% or more of the center of the power supply voltage.

Based on the peak level of the envelope of the high frequency signal output from the wave detector 103 and the power supply voltage, the wireless communication device 20 grasps the voltages appearing at the drain terminals of the transistors 207 and 208. Moreover, in order to inhibit HCI degradation of the transistors 207 and 208, the controller 10 causes the power supply regulation circuit 125 and the current regulation circuit 126 regulate the power supply voltage and the operating current of the high frequency power amplifier 101.

Accordingly, the wireless communication device 20 can inhibit HCI degradation of the transistors 207 and 208, so that the product life of the wireless communication device 20 can be extended. Further, the wireless communication device 20 can diminish power consumption.

Even under the situation where the voltage applied between the drain and the source of the transistor exceeds the power supply voltage, the wireless communication device 20 can inhibit HCI degradation of the transistor. Accordingly, the product life of the wireless communication device 20 can be extended.

When the output power of the high frequency power amplifier 101 is large, the wireless communication device 20 can inhibit HCI degradation of the transistors 207 and 208. When the output power of the high frequency power amplifier 101 is small, the wireless communication device 20 can inhibit heat generation of the power source, so that power consumption can be inhibited.

The wireless communication device 20 can easily control the power supply voltage regulation circuit 125 and the current regulation circuit 126 by use of the table stored in the nonvolatile memory 15.

Further, the wireless communication deice 20 inputs the signal output from the wave detector 103 to the ADCs 115 when controlling the power supply voltage regulation circuit 125 and the current regulation circuit 126 by use of the switch 113 that switches the signals input to the ADCs 115. The wireless communication device 20 can thereby use the ADCs 115 of the reception system that can perform high speed signal processing also for controlling the transmission system circuit. Consequently, the wireless communication device 20 can reduce the circuit scale of the ADCs 115.

The present application is based on Japanese Patent Application No. 2012-060543 filed on Mar. 16, 2012, the contents of which are incorporated herein by reference.

Although the embodiment has been described by reference to the drawings, it goes without saying that the disclosure is not limited to the disclosure. It is manifest to those who are skilled in the art that various alterations or modifications be conceivable within the scope of the claims, and the alterations or modifications should be construed as naturally falling within a technical scope of the disclosure.

REFERENCE SIGNS LIST

10: CONTROLLER
15: NONVOLATILE MEMORY
20: WIRELESS COMMUNICATION DEVICE
100: TRANSMISSION ANTENNA
101: HIGH FREQUENCY POWER AMPLIFIER
102: DRIVER AMPLIFIER
103: WAVE DETECTOR
104: ORTHOGONAL MODULATOR
105: TRANSMISSION SYSTEM VARIABLE GAIN AMPLIFIER
106: DAC
107: 90-DEGREE PHASE SHIFTER
108: OSCILLATOR
109: 90-DEGREE PHASE SHIFTER
110: RECEPTION ANTENNA
111: LOW NOISE AMPLIFIER
112: ORTHOGONAL DEMODULATOR
113: SWITCH
114: RECEPTION SYSTEM VARIABLE GAIN AMPLIFIER
115: ADC
125: POWER SUPPLY VOLTAGE REGULATION CIRCUIT
126: CURRENT REGULATION CIRCUIT
200: POSITIVE INPUT GATE TERMINAL
201: INVERTED INPUT GATE TERMINAL
202: OUTPUT MATCHING CAPACITANCE
203: TRANSFORMER
204: COUPLER
205: OUTPUT TERMINAL
206: COUPLER OUTPUT TERMINAL
207: TRANSISTOR
208: TRANSISTOR
209: INVERTED DRAIN OUTPUT TERMINAL
210: POSITIVE DRAIN OUTPUT TERMINAL.
211: TRANSFORMER

The invention claimed is:

1. A wireless communication device comprising:
a high frequency power amplifier, configured to amplify a high frequency signal by use of a power amplifying element;
a wave detector, configured to detect the amplified high frequency signal based on an output from the high frequency power amplifier;
an analog-digital converter, configured to determine a peak voltage of an envelope of the detected high frequency signal output from the wave detector;
a power supply voltage regulation circuit, configured to regulate a power supply voltage supplied to the high frequency power amplifier; and
a controller, configured to regulate an additional value to fall within a predetermined range, wherein the additional value is calculated by adding the power supply voltage supplied by the power supply voltage regulation circuit to the determined envelope peak voltage of the high frequency signal.

2. The wireless communication device according to claim 1, further comprising
a current regulation circuit, configured to regulate an operating current for the power amplifying element, wherein
the controller causes the power supply voltage regulation circuit and the current regulation circuit to decrease a power supply voltage supplied to the high frequency power amplifier and additionally increase the operating current for the power amplifying element when an output power from the high frequency power amplifier is comparatively large, whereas
the controller causes the power supply voltage regulation circuit and the current regulation circuit to increase the power supply voltage supplied to the high frequency power amplifier and additionally decrease the operating current for the power amplifying element when the output power from the high frequency power amplifier is comparatively small.

3. The wireless communication device according to claim 2, wherein
when the high frequency signal input to the high frequency power amplifier is an unmodulated signal, the controller causes the power supply voltage regulation circuit to control the power supply voltage and the current regulation circuit to control the operating current based on the additional value which is calculated by adding the supplied power supply voltage to the determined envelope peak voltage of the high frequency signal.

4. The wireless communication device according to claim 2, further comprising:
a table which shows a relationship between an output power of the high frequency signal amplified by the high frequency power amplifier, a power supply voltage supplied to the high frequency power amplifier, and an operating current for the power amplifying element, wherein
the controller causes the power supply voltage regulation circuit and the current regulation circuit to control the power supply voltage and the operating current based on the output power of the high frequency signal amplified by the high frequency power amplifier with reference to the table.

5. The wireless communication device according to claim 1, further comprising
a switch for switching a signal to be input to the analog-digital converter, wherein
the switch outputs the detected signal from the wave detector to the analog-digital converter by controlling of the controller.

6. The wireless communication device according to claim 1, wherein
the predetermined range indicates values not exceeding a specified value of hot carrier injection degradation of the power amplifying element.

* * * * *